(12) United States Patent
Mattisson et al.

(10) Patent No.: US 7,890,076 B2
(45) Date of Patent: Feb. 15, 2011

(54) MIXER CIRCUIT AND METHOD

(75) Inventors: Sven Mattisson, Bjärred (SE); Magnus Nilsson, Lund (SE); Andreas Nydahl, Osby (SE); Thomas Mattsson, Limhamn (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 502 days.

(21) Appl. No.: 11/551,464

(22) Filed: Oct. 20, 2006

(65) Prior Publication Data

US 2007/0142019 A1    Jun. 21, 2007

Related U.S. Application Data

(60) Provisional application No. 60/750,583, filed on Dec. 15, 2005.

(51) Int. Cl.
*H04B 1/26* (2006.01)
(52) U.S. Cl. .................. 455/323; 455/313; 455/319; 327/101; 327/119
(58) Field of Classification Search .......... 455/424, 455/425, 456.5, 561, 550.1, 575.1, 147, 313, 455/319, 323, 333, 326, 302, 296; 327/355, 327/101, 116, 119, 96, 254; 330/305, 182, 330/197, 171
See application file for complete search history.

(56) References Cited

U.S. PATENT DOCUMENTS

| | | | | |
|---|---|---|---|---|
| 3,854,098 | A * | 12/1974 | Takahashi et al. | ........... 329/326 |
| 5,168,242 | A * | 12/1992 | Willems et al. | ............... 330/54 |
| 6,029,059 | A | 2/2000 | Bojer | |
| 6,073,002 | A * | 6/2000 | Peterson | ..................... 455/326 |
| 6,542,724 | B1 * | 4/2003 | Copeland et al. | ............ 455/302 |
| 6,560,451 | B1 | 5/2003 | Somayajula | |
| 6,871,057 | B2 * | 3/2005 | Ugajin et al. | ............... 455/323 |
| 7,062,247 | B2 * | 6/2006 | Kovacevic et al. | .......... 455/323 |
| 7,120,414 | B2 * | 10/2006 | Kim et al. | ................... 455/313 |
| 7,177,616 | B2 * | 2/2007 | Connell et al. | .............. 455/296 |

(Continued)

OTHER PUBLICATIONS

Svitek, Richard et al. "5-6 GHz SiGe Active I/Q Subharmonic Mixers with Power Supply Noise Effect Characterization." IEEE Microwave and Wireless Components Letters, vol. 14., No. 7, Jul. 2004, pp. 319-321.

(Continued)

*Primary Examiner*—Duc Nguyen
*Assistant Examiner*—Charles Chow
(74) *Attorney, Agent, or Firm*—Coats & Bennett, P.L.L.C.

(57) ABSTRACT

A method of providing an input signal to a mixer circuit comprises coupling an output signal from a low-noise amplifier circuit to a mixer input of the mixer circuit via an AC coupling circuit, comprising an inductive of capacitive coupling circuit. For capacitive coupling configurations, a coupling capacitor is configured to have a capacitance value determined as a function of a transconductance sensitivity of the mixer circuit. For balanced output configurations of the low-noise amplifier circuit, matched coupling capacitors are used for coupling the balanced output signals to respective inputs of the mixer circuit. In one embodiment, the mixer circuit comprises a quadrature mixer circuit, which may be in a balanced or double-balanced configuration. In another embodiment, the mixer circuit comprises a four-phase mixer circuit, which may be configured as a balanced four-phase mixer circuit coupled to the low-noise amplifier circuit via inductive or capacitive embodiments of the coupling circuit.

6 Claims, 10 Drawing Sheets

U.S. PATENT DOCUMENTS

| | | | | |
|---|---|---|---|---|
| 7,333,565 | B2* | 2/2008 | Oono et al. | 375/307 |
| 7,358,885 | B2* | 4/2008 | Maxim et al. | 341/144 |
| 7,460,844 | B2* | 12/2008 | Molnar et al. | 455/130 |
| 2003/0003952 | A1* | 1/2003 | Kim | 455/552 |
| 2003/0114129 | A1* | 6/2003 | Jerng | 455/323 |
| 2003/0130006 | A1* | 7/2003 | Reynolds | 455/550 |
| 2003/0162515 | A1 | 8/2003 | Zhou | |
| 2004/0021497 | A1* | 2/2004 | Beland | 327/355 |
| 2005/0101281 | A1* | 5/2005 | Schelmbauer | 455/323 |
| 2005/0124311 | A1* | 6/2005 | Mahmoudi et al. | 455/323 |
| 2005/0170806 | A1* | 8/2005 | Kim | 455/323 |
| 2005/0253659 | A1* | 11/2005 | Favrat et al. | 331/57 |
| 2005/0270081 | A1 | 12/2005 | Shi et al. | |
| 2006/0079194 | A1* | 4/2006 | Tired et al. | 455/283 |
| 2006/0199562 | A1* | 9/2006 | Taylor | 455/333 |
| 2006/0208937 | A1* | 9/2006 | Hurrell et al. | 341/155 |
| 2007/0024377 | A1* | 2/2007 | Wang et al. | 330/305 |
| 2007/0140328 | A1* | 6/2007 | Sato et al. | 375/229 |
| 2008/0139149 | A1* | 6/2008 | Mu et al. | 455/200.1 |
| 2008/0284487 | A1* | 11/2008 | Pullela et al. | 327/355 |

OTHER PUBLICATIONS

Feng, H. et al. "A 5GHz Sub-Harmonic Direct Down-Conversion Mixer for Dual-Band System in 0.35um SiGe BiCMOS." IEEE International Symposium on Circuits and Systems, May 23-26, 2005, vol. 5, pp. 4807-4810.

Rogin, Jurgen et al. "A 1.5-V 45-mW Direct-Conversion WCDMA Receiver IC in 0.13-um CMOS." IEEE Journal of Solid-State Circuits. vol. 38, No. 12, Dec. 2003, pp. 2239-2248.

Razavi, Behzad. "Design Considerations for Direct-Conversion Receivers." IEEE Transactions on Circuits and Systems—II: Analog and Digital Signal Processing, vol. 44, No. 6, Jun. 1997, pp. 428-435.

Kivekas, Kalle et al. "Characterization of IIP2 and CD-Offsets in Transconductance Mixers." IEEE Transactions on Circuits and Systems—II: Analog and Digital Signal Processing, vol. 48, No. 11, Nov. 2001, pp. 1028-1038.

Takahashi, Chikau et al. "A 1.9GHz Si Direct Conversion Receiver IC for QPSK Modulation Systems." 1995 IEEE International Solid-State Circuits Conference, Feb. 1995, pp. 138-140.

Razavi, Behzad. "A 1.5V 900MHz Downconversion Mixer." IEEE International Solid-State Circuits Conference Digest of Technical Papers, Feb. 1996, pp. 48-49.

* cited by examiner

MIXER CIRCUIT AND METHOD

RELATED APPLICATIONS

This application claims priority under 35 U.S.C. §119(e) from the provisional patent application entitled "Receiver LNA and Mixer with Low Second-Order Distortion," filed on 15 Dec. 2005 and assigned Ser. No. 60/750,583, and which is incorporated herein by reference.

BACKGROUND

The present invention generally relates to communication receivers, and particularly relates to mixer circuits for use in communication receivers.

Communication receiver circuits operate in challenging performance environments. For example, in Frequency Division Multiple Access (FDMA) systems, such as those configured according to Wideband CDMA (WCDMA) standards, the receiver operates concurrently with the local transmitter and must exhibit good transmit frequency rejection. Casting the self-interference problem in numeric terms, a WCDMA transmitter at +25 dBm results in a −25 dBm interferer signal into the WCDMA receiver, assuming receive/transmit duplexer attenuation of 50 dB. If receiver performance criteria require no more than −108 dBm of static interference, then the receiver's second-order intercept point ($IP_2$) must be $\geq$+49 dBm for the rectified transmit spectrum to be below the −108 dBm limit.

Placing a suppression filter between the receiver's low-noise amplifier and mixer circuit represents one approach to suppressing interference, including "leakage" interference from the local transmitter. However, the proximity of transmit and receive frequencies, sometimes referred to as the "duplex distance," requires relatively stringent filter performance characteristics on these suppression filters. Indeed, the required filter sharpness leads to the use of Surface Acoustic Wave (SAW) filters, or other high-performance filter circuits, which prevent easy integration with on-chip transceiver circuits.

SUMMARY

In one embodiment, a receiver circuit comprises a low-noise amplifier circuit, a quadrature mixer circuit, and a capacitive coupling circuit comprising matched capacitive coupling circuits to couple an output signal of the low-noise amplifier circuit into quadrature inputs of the quadrature mixer circuit. The low-noise amplifier circuit may comprise a single-ended amplifier providing single or balanced output signals. In either case, the capacitive coupling circuit provides one or more coupling capacitors for coupling the low-noise amplifier circuit's output signal(s) to mixer inputs. For balanced low-noise amplifier output configurations, the capacitive coupling includes split coupling paths, with each path having a matched coupling capacitor.

In another embodiment, a receiver circuit comprises a low-noise amplifier circuit, a four-phase mixer circuit, and a capacitive coupling circuit to couple an output signal of the low-noise amplifier circuit into a mixer input of the four-phase mixer circuit. The low-noise amplifier circuit may be a single-ended low-noise amplifier circuit providing a single output signal, wherein the capacitive coupling circuit couples the single output signal into a single-ended mixer input of the four-phase mixer circuit. In another embodiment, the four-phase mixer circuit comprises a double-balanced four-phase mixer circuit, and the low-noise amplifier circuit includes a balanced output. In such configurations, the capacitive coupling circuit includes matched coupling capacitors capacitively coupling balanced output signals from the low-noise amplifier circuit to respective balanced mixer inputs of the double-balanced four-phase mixer circuit. The balanced mixer inputs of the double-balanced four-phase mixer circuit may comprise single-ended termination circuits.

In both quadrature and four-phase mixer embodiments, the capacitive coupling circuit can be configured in consideration of the mixer's transconductance sensitivity. For example, the coupling capacitor used to couple the low-noise amplifier circuit's output signal can be sized as a function of the mixer circuit's transconductance sensitivity. In one embodiment, the coupling capacitor is sized such that $\omega C \leq g_m$, where $\omega$ is a frequency of interest, C is a capacitance value of the coupling capacitor, and $g_m$ is a transconductance value of the mixer circuit. If balanced outputs are provided by the low-noise amplifier circuit, then appropriately-sized, matched coupling capacitors can be used in each of the balanced signal paths.

In another embodiment, a receiver circuit comprises a low-noise amplifier circuit, a quadrature mixer circuit, and an inductive coupling circuit. The inductive coupling circuit comprises one or more transformer-coupled inductors configured to couple an output signal of the low-noise amplifier circuit into quadrature inputs of the quadrature mixer circuit.

In one or more such embodiments, the low-noise amplifier circuit comprises a single-ended low-noise amplifier circuit providing a single output signal, wherein the one or more transformer coupled inductors of the inductive coupling circuit comprise a transformer-coupled inductor providing a balanced RF input signal to the quadrature mixer circuit. In at least one embodiment, the mixer circuit comprises a quadrature mixer circuit configured for four-phase local oscillator drive signals, and the one or more transformer coupled inductors of the inductive coupling circuit split the single output signal into a pair of balanced RF input signals. In such embodiments, the inductive coupling circuit may comprise a pair of matched transformer-coupled inductors, which are coupled to an inductor winding in the low-noise amplifier circuit.

Thus, coupling into the mixer circuit as contemplated herein includes inductive and capacitive coupling embodiments, and includes split and non-split RF output signals from single-ended embodiments of the low-noise amplifier. Further, the amplifier/mixer embodiments taught herein offer a number of performance advantages. Such advantages include, but are not limited to simplified RF paths, reduced power consumption as compared to the use of additional gain stages, and good low-frequency noise rejection and parameter controllability through use of properly sized amplifier-to-mixer coupling capacitors.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
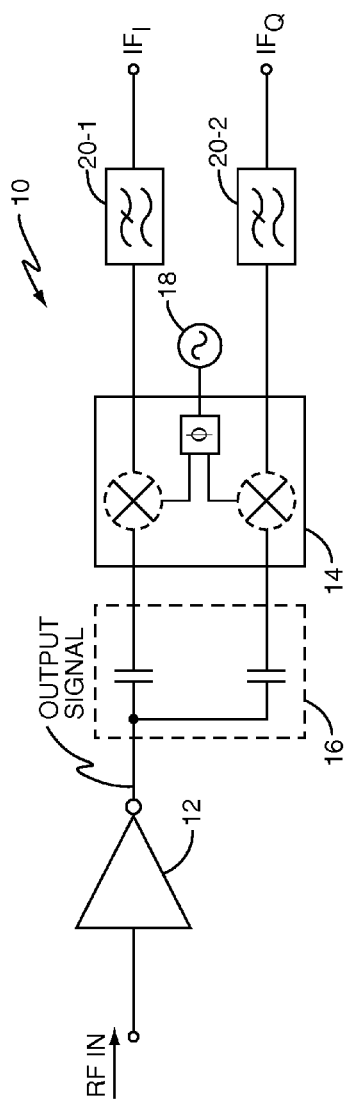
FIG. 1 is a block diagram of one embodiment of a receiver circuit.

FIG. 1 partially illustrates a wireless communication receiver, such as used in a cellular radiotelephone or other wireless communication device, wherein a receiver circuit 10 comprises a low-noise amplifier circuit 12, a mixer circuit 14, and a coupling circuit 16, implemented here as a capacitive coupling circuit. FIG. 1 further illustrates a local oscillator circuit 18 that provides local oscillator (LO) signals to the mixer circuit 14 for down-conversion of the output signal of the low-noise amplifier circuit 12 from a received RF frequency to intermediate frequency (IF) signals, which may be filtered via filter circuits 20-1 and 20-2. While the illustration depicts these filter circuits as outputting filtered $IF_I$ and $IF_Q$ signals, corresponding to the illustrated quadrature (I and Q) configuration of the mixer circuit 14, the mixer circuit 14 is not limited to quadrature configurations, nor is it limited to IF conversions.

In operation, the low-noise amplifier circuit 12 generates its output signal responsive to an RF input signal, such as a filtered, antenna-received radio communication signal. In turn, the coupling circuit 16 AC-couples the output signal into corresponding input(s) of the mixer circuit 14. To understand at least some of the advantages of this configuration, FIG. 2 illustrates a quadrature-mixer embodiment of the receiver circuit 10.

Figure 2:
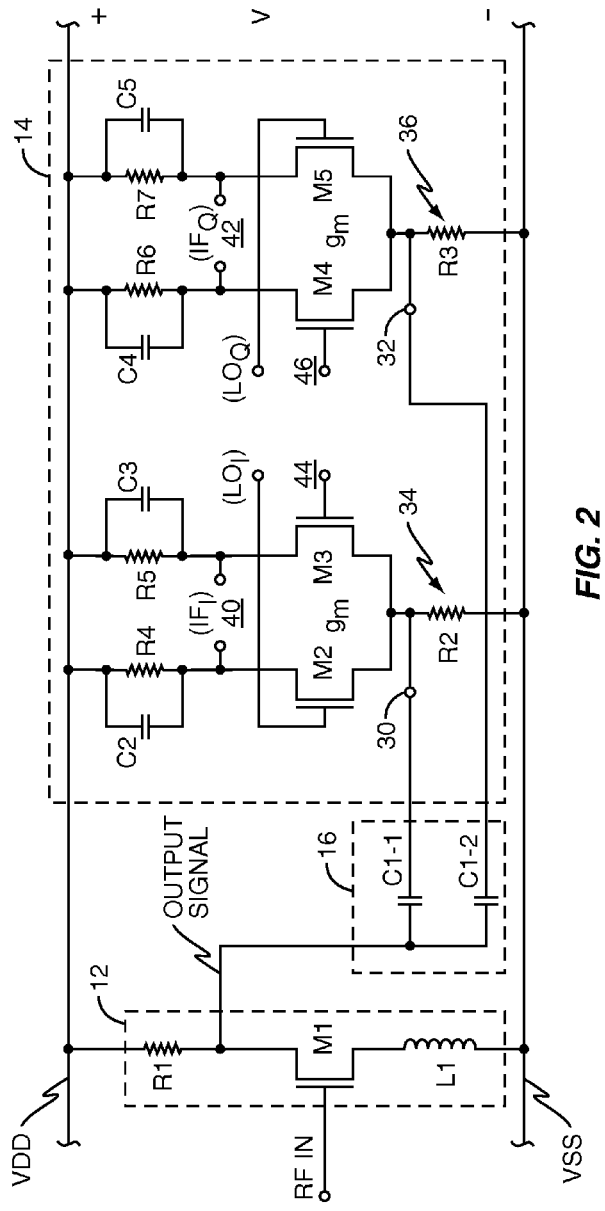
FIG. 2 is a block diagram of one embodiment of amplifier, mixer, and coupling circuits for use in a wireless communication receiver.

In FIG. 2, the low-noise amplifier circuit 12 comprises an input transistor M1, a load resistor R1, and a source degeneration inductor L1. The resistor R1 couples the input transistor drain to a first supply rail (e.g., a VDD connection), and operates as the output load from which the amplifier's output signal is taken, while the degeneration inductor L1 provides impedance matching for the source (not shown) driving the RF IN signal into the low-noise amplifier circuit 12.

The illustrated embodiment of the coupling circuit 16 comprises parallel coupling paths, with each path including one of the two matched coupling capacitors C1-1 and C1-2. With this configuration, the coupling circuit 16 splits the single-ended output signal from the low-noise amplifier circuit 12 into a first signal applied to a first quadrature mixer input 30, and a second signal applied to a second quadrature mixer input 32. Note that the mixer circuit 14 provides single-ended termination circuits 34 and 36, coupling the mixer inputs 30 and 32 to a second supply rail (e.g., the resistors R2 and R3 coupling the inputs 30 and 32 to a VSS or ground connection).

The illustrated mixer circuit 14 further comprises a mixer core circuit that includes transistor pairs M2/M3 and M4/M5. Resistors R4 and R5 couple the M2/M3 transistor pair to the VDD supply rail and the resistors R6 and R7 similarly couple the M4/M5 transistor pair to the VDD supply rail. Respective ones of capacitors C2-C5 connect in parallel with respective ones of the resistors R4-R7. With this circuit configuration, outputs 40 and 42 provide the quadrature mixer output signals $IF_I$ and $IF_Q$, which derive from the RF signal applied to inputs 30 and 32 and the local oscillator signals $LO_I$ and $LO_Q$, respectively applied to the inputs 44 and 46, which couple to the gate connections of the M2/M3 and M4/M5 transistor pairs.

By way of non-limiting example, C1-1 and C1-2 may have a capacitance of 0.5 to 10 pF, the resistor R1 may have a resistance of 100 to 1000 Ohms, the resistors R2 and R3 may have a resistance of 100 to 1000 Ohms, and the mixer circuit 14 may have a transconductance $g_m$ of 50 to 200 mS. Of course, the absolute and relative values of these and other components illustrated in FIG. 2 will vary as needed or desired, according to design requirements.

Figure 3:
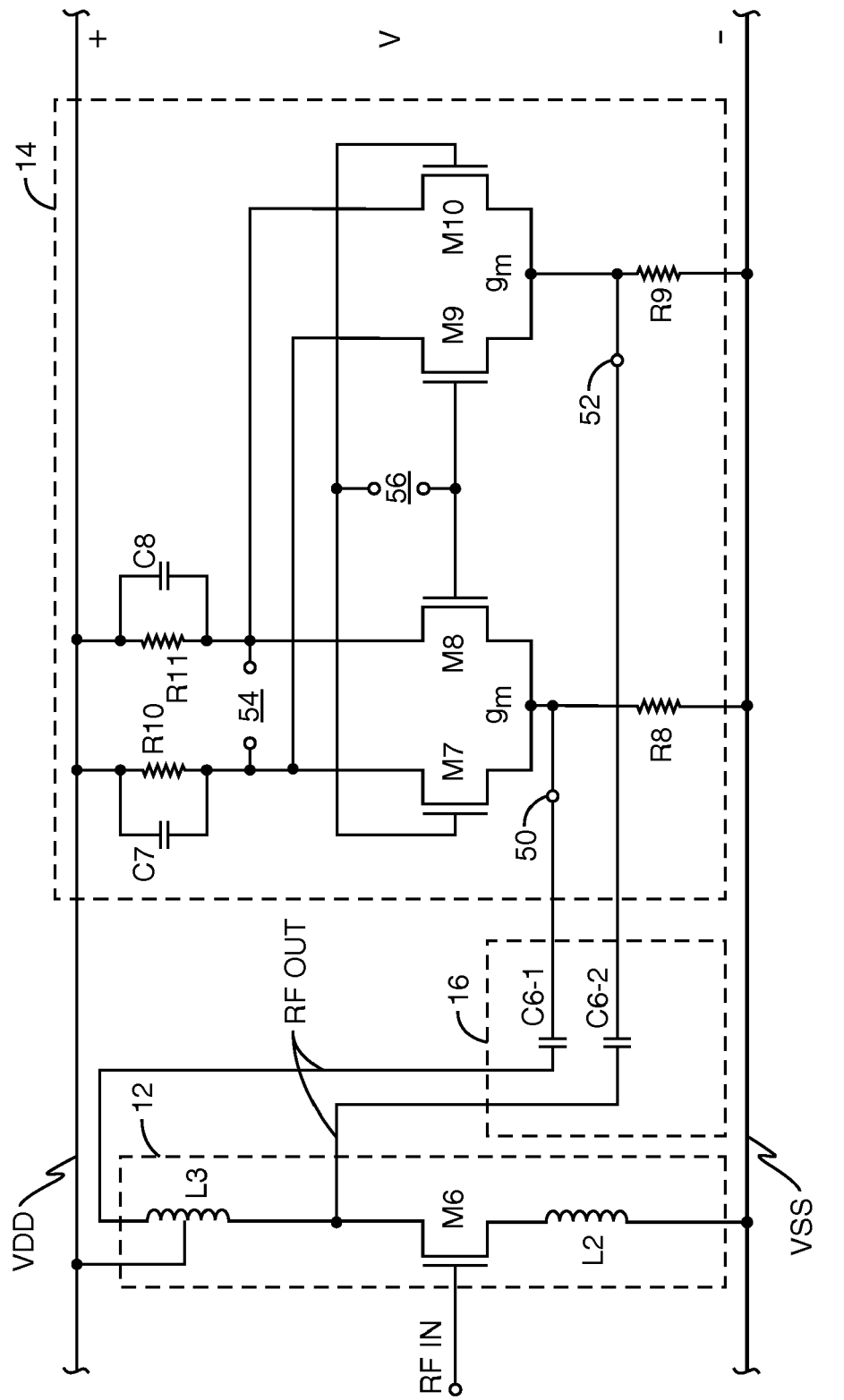
FIG. 3 is a block diagram of another embodiment of amplifier, mixer, and coupling circuits for use in a wireless communication receiver.

FIG. 3 illustrates a balanced quadrature mixer embodiment, which is similar to the quadrature mixer embodiment of FIG. 2. However, here, the low-noise amplifier circuit 12 comprises an input transistor M6, a source degeneration inductor L2, and a load inductor L3, which provides balanced RF output signals that couple through matched coupling capacitors C6-1 and C6-2 of the coupling circuit 16 to respective ones of RF inputs 50 and 52 of the mixer circuit 14, which are terminated via resistors R8 and R9, respectively. As a non-limiting example, the balun inductor L3 may have an inductance of 1 to 20 nH. Note, too, that the use of a transformer or differential amplifier to obtain balanced outputs from the low-noise amplifier circuit 12 is contemplated herein. For example, in some embodiments, it may be advantageous to use a transformer circuit suitable for on-chip integration.

Continuing with circuit element descriptions, the mixer core circuit includes the transistor pairs M7/M8 and M9/M10, with the M7/M8 transistor pair coupled to the VDD supply rail through the parallel resistor/capacitor connections formed by R10/C7 and R11/C8. In this configuration of the mixer circuit 14, the M9/M10 transistor pair share the R10/C7 and R11/C8 connections with the M7/M8 transistor pair, and output 54 provides the IF output signal, which derives from the balanced RF signals applied to RF inputs 50 and 52 and the local oscillator signal applied to the LO input 56.

Figure 4:
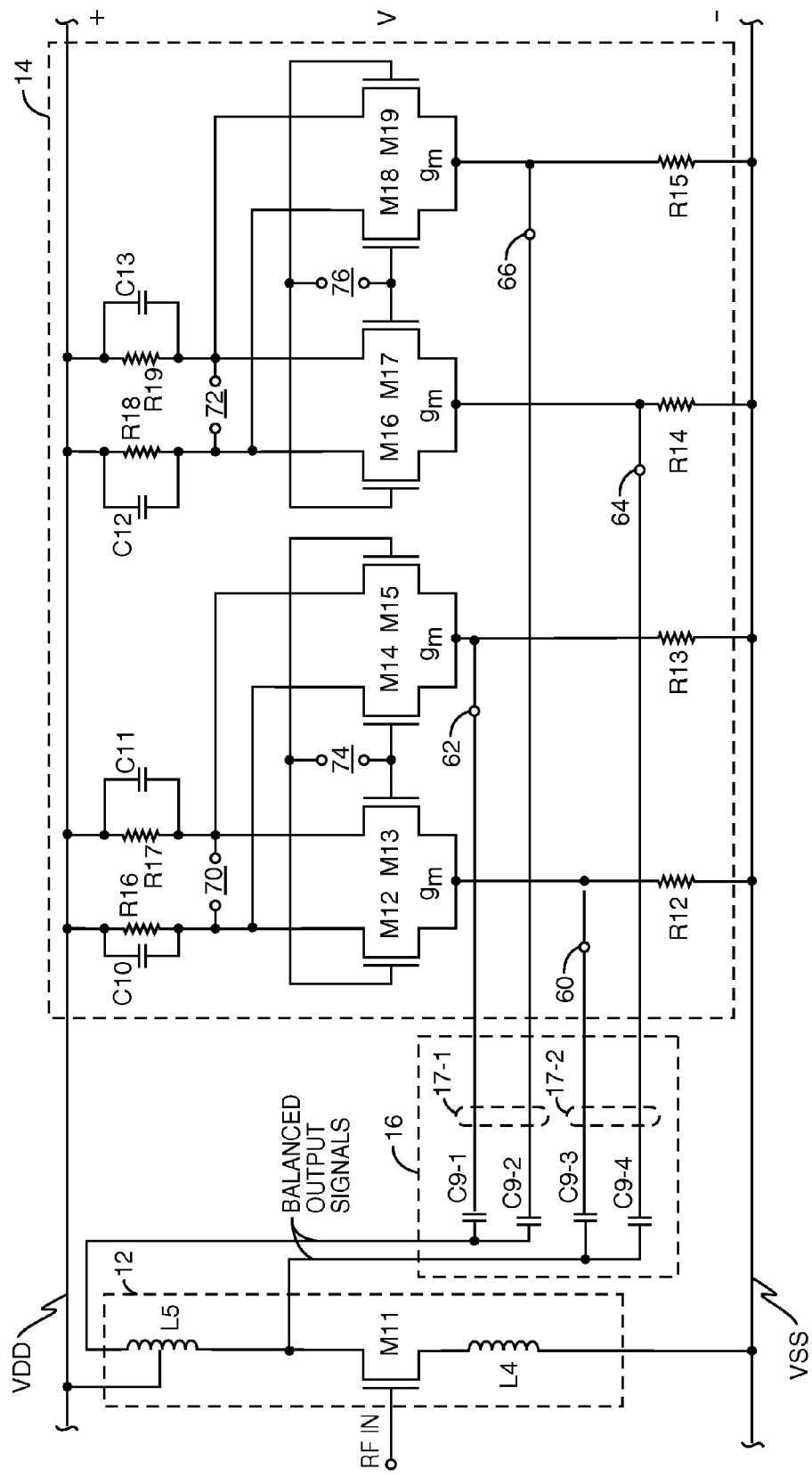
FIG. 4 is a block diagram of another embodiment of amplifier, mixer, and coupling circuits for use in a wireless communication receiver.

Offering another balanced, quadrature example, FIG. 4 illustrates a double-balanced quadrature mixer embodiment. Here, the low-noise amplifier circuit 12 comprises an input transistor M11, a source degeneration inductor L4, and a load inductor L5, which provides balanced RF output signals. However, unlike the balanced quadrature embodiment of FIG. 3, the coupling circuit 16 includes matched coupling capacitors C9-1 through C9-4. Capacitors C9-1 and C9-2 split one of the balanced RF output signals from the low-noise amplifier circuit 12 into the split parallel path denoted as 17-1, while capacitors C9-3 and C9-4 split the other balanced output signal from the low-noise amplifier circuit 12 into the split parallel path denoted as 17-2. More particularly, capacitor C9-1 couples one branch of the split parallel path 17-1 to RF input 62 of the mixer circuit 14, while C9-2 couples the other branch of the split parallel path 17-1 to RF input 66 of the mixer circuit 14. Similarly, capacitor C9-3 couples one branch of the split parallel path 17-2 to RF input 60 of the mixer circuit 14, while C9-4 couples the other branch of the split parallel path 17-2 to RF input 64 of the mixer circuit 14. Thus, RF inputs 60, 62, 64, and 66 of the mixer circuit 14 receive respective ones of these split-path, AC-coupled signals, and the mixer circuit 14 provides single-ended termination circuits for each such RF input via the resistors R12-R15.

The mixer core circuit 14 includes the transistor pairs M12/M13, M14/M15, M16/M17, and M18/M19. The M12/M13 and M14/M15 transistor pairs are coupled to the VDD supply rail through the parallel resistor/capacitor connections formed by R16/C10 and R17/C11 and, similarly, the M16/M17 and M18/M19 transistor pairs coupled to the VDD supply rail through the parallel resistor/capacitor connections formed by R18/C12 and R19/C13. With this configuration, output 70 provides first quadrature IF signals and output 72 provides second quadrature IF signals, where the mixer circuit 14 generates the IF signals responsive to the balanced RF signals applied to its RF inputs 60, 62, 64, and 66, and to the local oscillator inputs 74 and 76.

Figure 5:
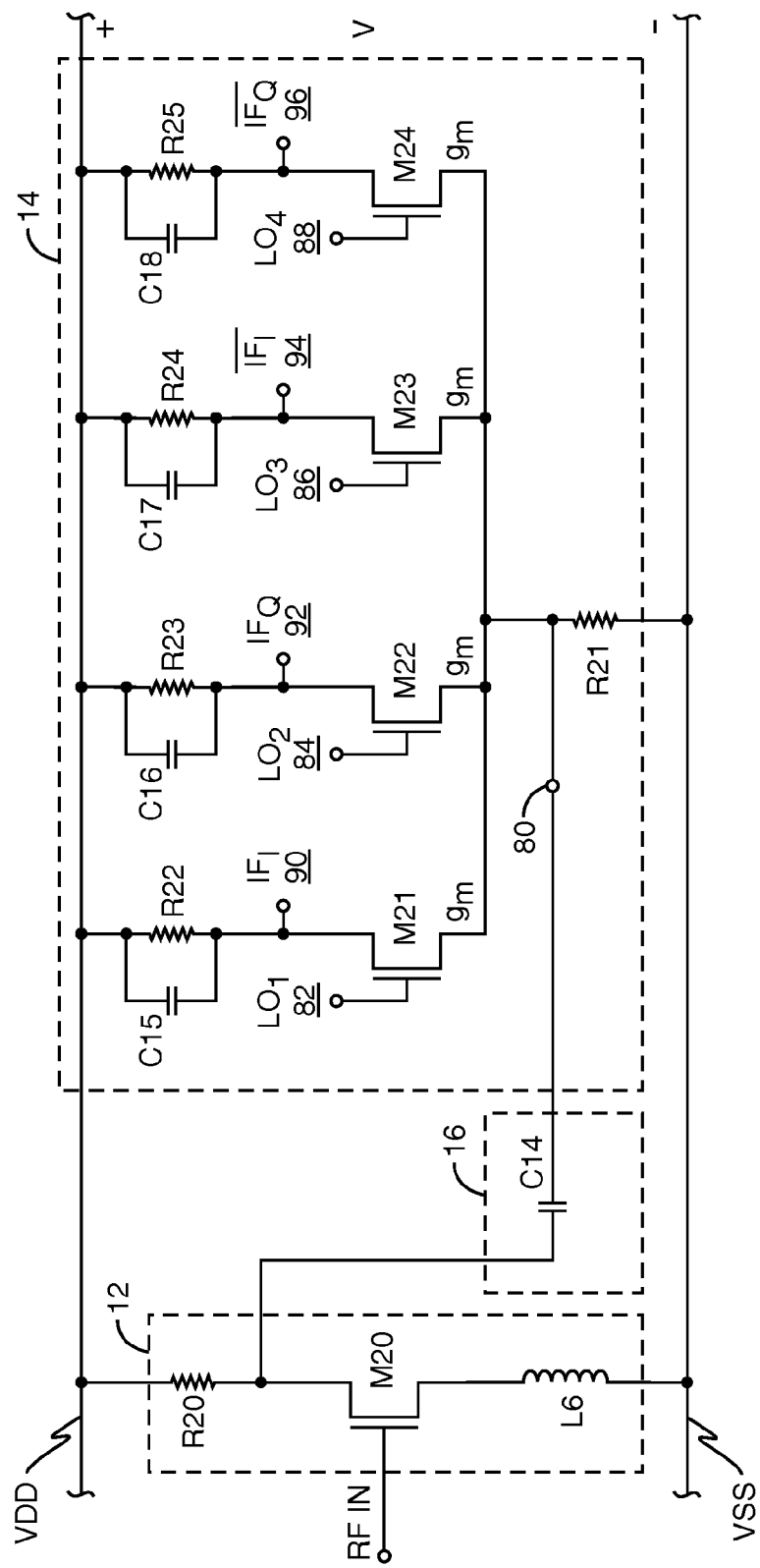
FIG. 5 is a block diagram of another embodiment of amplifier, mixer, and coupling circuits for use in a wireless communication receiver.

Turning from the above quadrature mixing embodiments, FIG. 5 illustrates one embodiment of the receiver circuit 10, wherein the mixer circuit 14 comprises a four-phase mixer. In more detail, the low-noise amplifier circuit 12 comprises an input transistor M20, a source degeneration inductor L6, and a load resistor R20, which provides a single-ended RF output signal to the mixer circuit 14 via the coupling capacitor C14 included in the coupling circuit 16.

The coupling capacitor C14 couples the amplifier's RF output signal to an RF input 80 of the mixer circuit 14, which is coupled to a ground or reference supply rail (VSS) through a single-ended termination circuit formed by the resistor R21. In its four-phase configuration, the mixer's core circuit includes the transistors M21, M22, M23, and M24, with these transistors driven in coordination by four-phase clock signals respectively applied to LO inputs 82, 84, 86, and 88. Transistor M21 couples to a VDD supply rail through parallel resistor/capacitor connections formed by R22/C15. The resistor/capacitor pairs R23/C16, R24/C17, and R25/C18 provide similar connections for the remaining core transistors. With that configuration, IF outputs 90, 92, 94, and 96 provide the four-phase IF output signals derived from the RF signal applied to RF input 80 and the four-phase LO signals applied to LO inputs 82, 84, 86, and 88.

Figure 6:
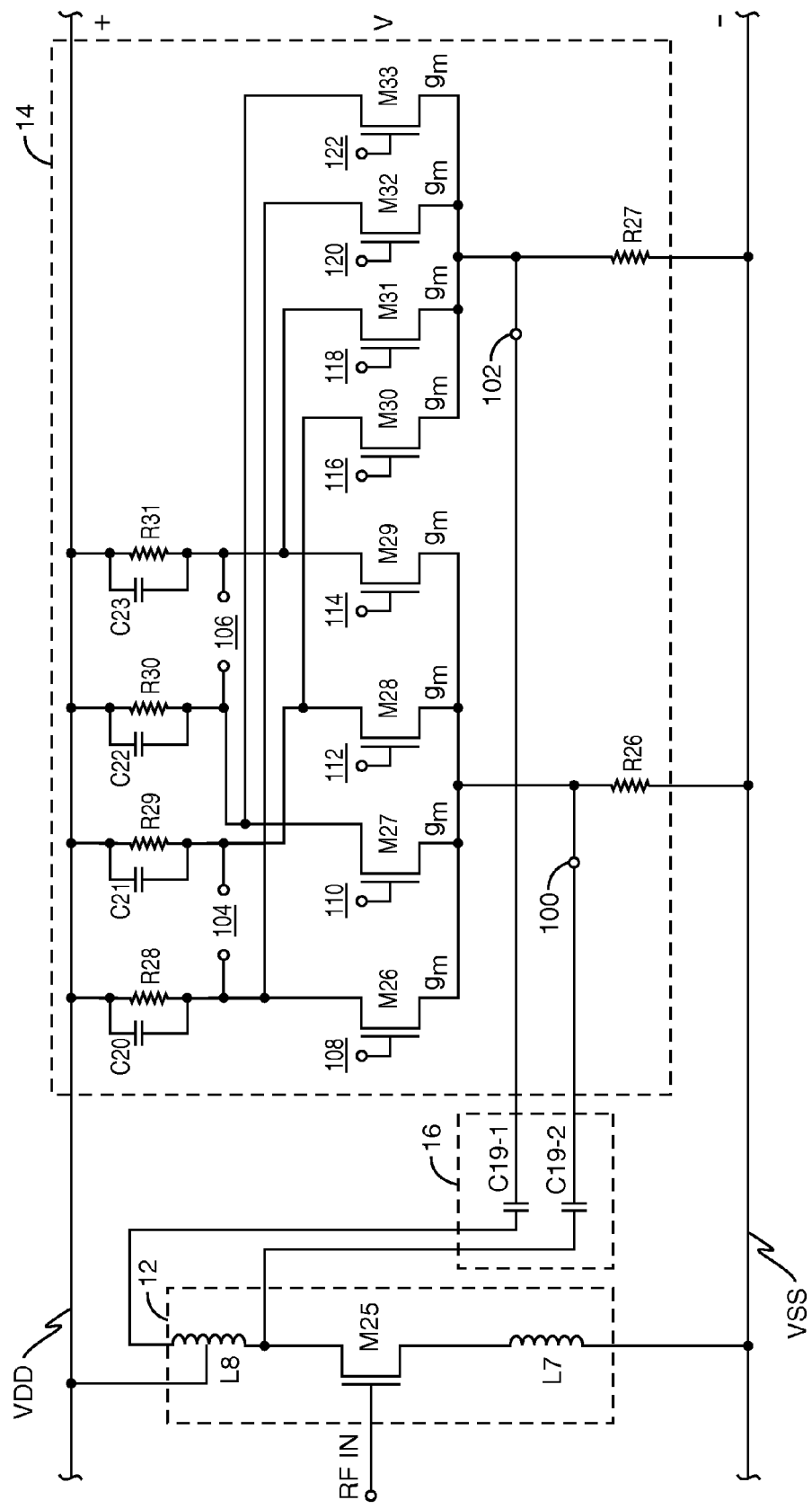
FIG. 6 is a block diagram of another embodiment of amplifier, mixer, and coupling circuits for use in a wireless communication receiver.

Continuing with another four-phase embodiment, FIG. 6 illustrates a double-balanced, four-phase configuration of the receiver circuit 10. Here, the low-noise amplifier circuit 12 comprises an input transistor M25, a source degeneration inductor L7, and a load inductor L8, which provides balanced, single-ended RF output signals to the coupling circuit 16.

The coupling circuit 16 includes matched coupling capacitors C19-1 and C19-2, which couple the respective balanced RF output signals to RF inputs 100 and 102 of the mixer circuit 14. The RF inputs 100 and 102 respectively couple to a ground or reference supply rail (VSS) through single-ended termination circuits formed by the resistors R26 and R27. The RF inputs 100 and 102 also respectively couple the balanced RF output signals to the source nodes of the mixer core transistors, which comprise a first set of four-phase transistors M26, M27, M28, M29, and a second set of four-phase transistors M30, M31, M32, and M33.

The two sets of four-phase transistors share connections to the VDD supply rail through parallel resistor/capacitor connections formed by R28/C20, R29/C21, R30/C22, and R31/C23. The IF outputs 104 and 106 provide the mixer's IF output signals, which the mixer circuit 14 generates responsive to the balanced RF signals applied to its RF inputs 100 and 102, and the four-phase clock signals applied to its two sets of four-phase LO inputs 108, 110, 112, and 114, and 116, 118, 120, and 122.

The above embodiments of the receiver circuit 10 differ in regards to specific circuit implementations, e.g., balanced versus double-balanced, or quadrature versus four-phase, however, all such embodiments offer certain operational advantages, such as the combination of simplified RF paths, lower operating power requirements, and good noise performance. For example, with respect to FIG. 2, the "gain imbalance" between the IF$_I$ and IF$_Q$ signals provided at the IF outputs 40 and 42 depends on a number of variables, including unintended differences in the LO signal levels applied to the LO inputs 44 and 46, and differences in IF-side load impedances, e.g., post-mixer filtering and amplification circuits. However, mismatch in the transconductance sensitivity $g_m$ for the M2/M3 transistor pair and for the M4/M5 transistor pair represents a particularly influential quadrature imbalance factor.

According to methods taught herein, configuration of the coupling circuit 16 at least partially addresses transconductance imbalance in the mixer core. In one embodiment, the matched capacitive coupling capacitors C1-1 and C1-2 are each sized for a voltage drop of kT/q (≈25 mV at room temperature). The drops developed across the coupling capacitors C1-1 and C1-2 reduce the sensitivity of the mixer circuit 14 to imbalances in the transconductance gains $g_m$ of the quadrature transistor pairs M2/M3 and M4/M5 in the mixer core. More particularly, the voltage drops taken across the matched coupling capacitors C1-1 and C1-2 reduce gain sensitivity by a factor of $$\frac{j\omega C}{j\omega C + g_m} \qquad \text{Eq. (1)}$$

where C is the capacitance value, and ω represents a frequency of interest for the RF output signal(s) provided by the low-noise amplifier circuit 12.

Accordingly, the gain sensitivity compensation method taught herein sets the value of the matched coupling capacitors used in the coupling circuit 16 such that $\omega C \leq g_m$. With that relationship, the capacitance value of each coupling capacitor C1-1 and C1-2 dominates the transconductance sensitivity, meaning that close matching of C1-1 and C1-2 controls imbalance. Note that the above gain sensitivity compensation and capacitor sizing relationship also applies to four-phase mixer circuit embodiments, such as shown in FIG. 6, for example.

Controlling selected design and fabrication parameters ensures good capacitor matching. For example, if an integrated receiver circuit, such as an Application Specific Integrated Circuit (ASIC) embodies the receiver circuit 10, co-locating the C1-1 and C1-2 capacitors on the die minimizes process variations, and provides good thermal matching between the capacitors. Of course, implementing the C1-1 and C1-2 capacitors on the same metallization and insulation layers, using the same layouts and geometries further provides good capacitor-to-capacitor matching. These matching and sizing considerations apply, for example, to the matching capacitors shown in the various split-path embodiments of the coupling circuit 16.

The above capacitor sizing and matching considerations apply to the various split-path embodiments of the coupling circuit 16 shown herein, e.g., capacitors C1-1/C1-2, C6-1/C6-2, and C9-1/C9-2/C9-3/C9-4. Other design and implementation configurations yield further circuit improvements. For example, the use of four-phase mixing in the receiver circuit embodiments illustrated in FIGS. 5 and 6 provides operational improvements in the receiver circuit 10.

Understanding the four-phase mixing improvements begins with understanding the idealized behavior of switching mixers—i.e., mixer circuits where the LO signals switch the core transistors on and off. An ideal switching mixer is a linear time-varying device that generates a mixer output signal by multiplying the (RF) input signal with a time-domain square wave. Cast in the context of FIG. 5, the IF output signals taken from the outputs 90, 92, 94, and 96 represent the multiplication of the RF input signal applied to RF input 80 with the time-domain square waves applied to the LO inputs 82, 84, 86, and 88. The applied LO signals drive the gates of the mixer core transistors M21, M22, M23, and M24 to effect output (IF) signal generation.

Mixer gain can be evaluated by multiplying Fourier coefficients of the LO waveforms, with each multiplication resulting in sum and difference terms. In a two-phase mixer, the two LO signal waveforms are square waves having 50% duty cycles, meaning that the Fourier coefficients F of the LO signals can be represented as $$F_n = 2A \frac{t_0}{T} \cdot \frac{\sin\left(\frac{n\pi t_0}{T}\right)}{\frac{n\pi t_0}{T}} \quad \text{Eq. (2)}$$

where A=the amplitude of the LO square waves, T=the LO waveform period, $t_0$=the LO waveform duty cycle, and n is the harmonic number. With n=1, Eq. (2) yields $F_1 = A \cdot 2/\pi$ for two-phase 50% duty cycle LO waveforms, as are conventionally used. Conversely, for the 25% duty cycle LO waveforms used in the four-phase mixer embodiments of FIGS. 5 and 6, Eq. (2) yields $F_1 = A \cdot \sqrt{2}/\pi$.

For the 25% duty cycle case, one sees that the LO signal waveform amplitude A can be doubled without increasing the total current consumption of a four-phase mixer core as compared to an otherwise comparable two-phase mixer core. Doubling the amplitude provides a signal gain of $\sqrt{2}$ (3 dB). Alternatively, one could increase A by $\sqrt{2}$ to retain the same gain as the two-phase embodiment, but with a 3 dB reduction in noise floor. (The noise floor is proportional to the total current in the mixer core.) The 3 dB higher gain of the four-phase mixer for the same noise floor and current consumption as an otherwise comparable two-phase mixer circuit, provides improved noise performance without requiring the use of high-gain front-end amplifiers, or additional gain stages in the mixer core. Moreover, the AC coupling between the low-noise amplifier circuit 12 and the mixer circuit 14 of FIGS. 5 and 6 provides good rejection of second-order harmonic distortion components, which would otherwise flow into the mixer circuit 14 from the low-noise amplifier circuit 12.

Figure 7:
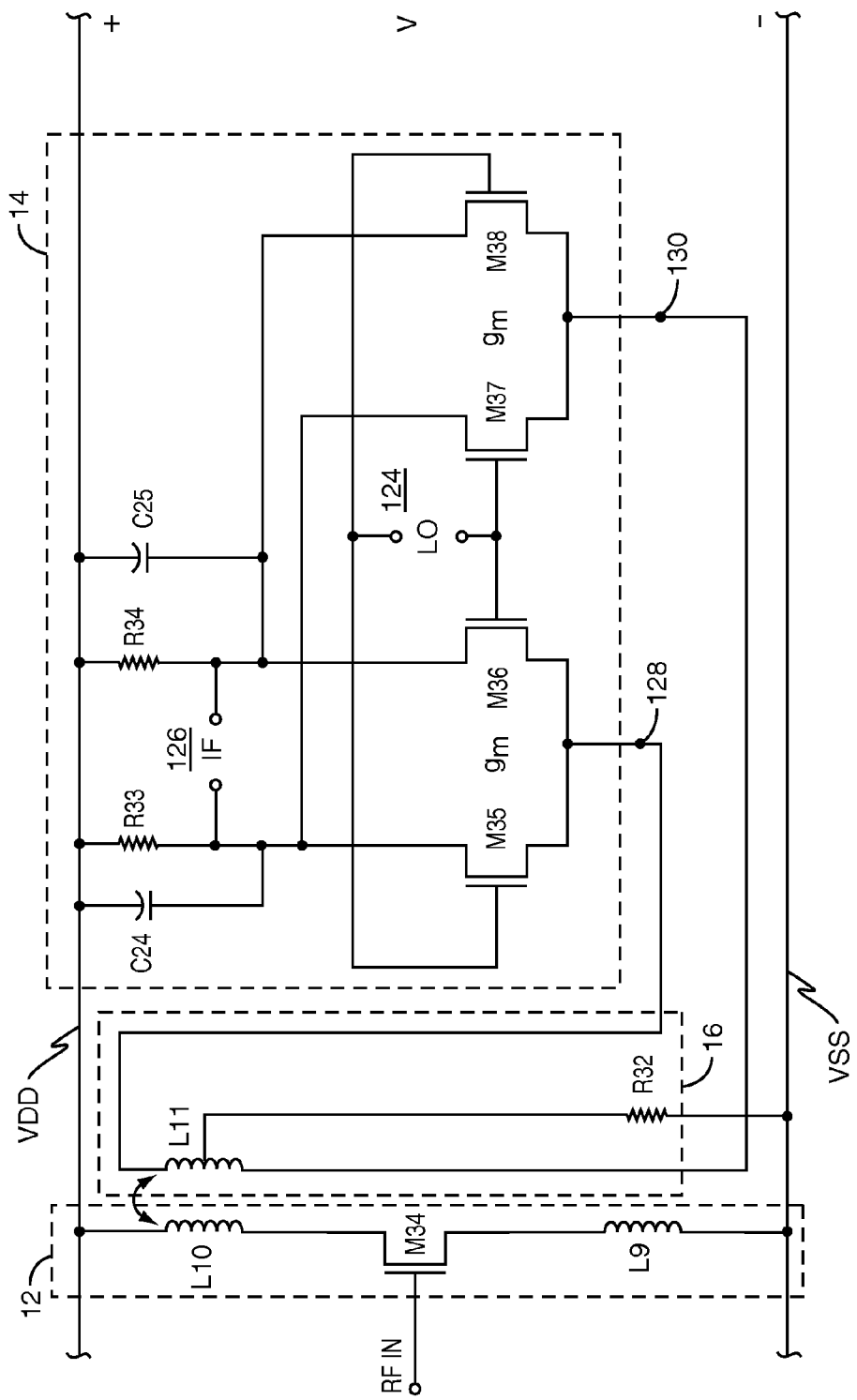
FIG. 7 is a block diagram of another embodiment of amplifier, mixer, and coupling circuits for use in a wireless communication receiver.

Other embodiments taught herein also provide good insensitivity to local oscillator and bias noise, along with good voltage headroom. FIG. 7 illustrates a receiver circuit comprising an embodiment of the low-noise amplifier circuit 12. The single-ended (RF) output signal from the low-noise amplifier circuit 12 is shown coupled to an embodiment of the mixer circuit 14 via the coupling circuit 16. Here, the coupling circuit 16 is configured as an inductive coupling circuit comprising one or more transformer-coupled inductors. That is, the one or more transformer coupled inductors in this embodiment of the coupling circuit 16 comprise a transformer-coupled inductor providing a balanced RF input signal to the mixer circuit 14.

More particularly, FIG. 7 illustrates a double-balanced, AC-coupled mixer embodiment with transformer balun. The low-noise amplifier circuit 12 comprises an input transistor M34, a source degeneration inductor L9, and a load inductor L10, which is transformer-coupled to the inductor L11 in the coupling circuit 16. Here, the coupling circuit 16 comprises an inductive coupling circuit where the L10 and L11 inductors form a transformer that couples the output of the low-noise amplifier circuit 12 into the mixer circuit 14. In this configuration, each end of the L11 inductor winding provides a balanced signal for input to the mixer circuit 14, while the resistor R32 couples the center tap of inductor L11 to the reference ground (VSS).

LO signals applied to the inputs 124 of the mixer circuit 14 drive the gates of the mixer core transistors M35, M36, M37, and M38. Thus, the IF outputs 126, which are coupled to the positive supply rail VDD through parallel RC circuits R33/C24 and R34/C25, provide intermediate frequency signals representing the multiplication of the RF input signals applied to RF inputs 128 and 130 with the time-domain square waves applied to the LO inputs 124.

Figure 8:
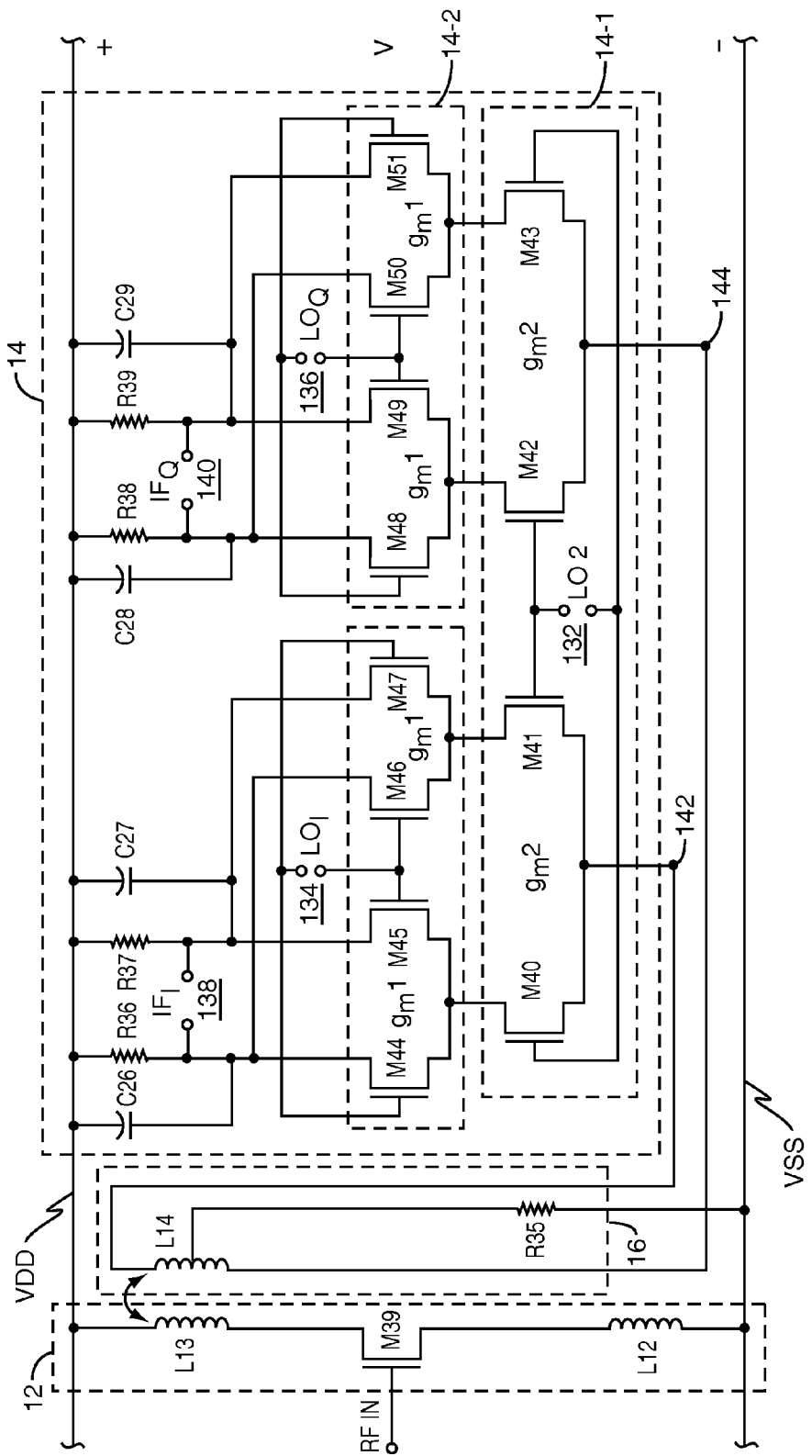
FIG. 8 is a block diagram of another embodiment of amplifier, mixer, and coupling circuits for use in a wireless communication receiver.

FIG. 8 illustrates another embodiment as a double-balanced, AC-coupled "stacked" quadrature mixer with transformer balun. This embodiment offers good insensitivity to local oscillator and bias noise, in combination with the advantages offered by the four-phase LO configuration. More particularly, the illustrated embodiment is configured for four-phase LO generation using quadrature LO signals at $f_0$ and a single LO signal at $2f_0$, all of which are generated at a 50% duty cycle. Among other things, the illustrated mixer configuration yields better gain (or lower noise) by eliminating signal splitting from the low-noise amplifier 12.

In the illustrated embodiment, the low-noise amplifier circuit 12 comprises an input transistor M39, a source degeneration inductor L12, and a load inductor L13, which is transformer-coupled to the inductor L14 in the coupling circuit 16, which, here, comprises an inductive coupling circuit. That is, the L13 and L14 inductors form a transformer which couples the output of the low-noise amplifier circuit 12 as an RF input signal into the mixer circuit 14. In this configuration, each end of the L14 inductor winding provides a balanced signal for input to the mixer circuit 14, while the resistor R35 couples the center tap of inductor L14 to the reference ground (VSS).

The $2f_0$ LO2 signal applied to the input 132 of the first mixer core 14-1 in the stacked core configuration drives the gates of the mixer core transistors M40, M41, M42, and M43. Similarly, the $f_0$ LO signals applied to the quadrature LO inputs 134 and 136 ($LO_I$ and $LO_Q$, respectively) in the second mixer core 14-2 drive the gates of the mixer core transistors M44, M45, M46, M47, M48, M49, M50, and M51. The quadrature IF outputs 138 and 140 ($IF_I$ and $IF_Q$, respectively) are coupled to a positive supply rail (VDD) through parallel RC circuits R36/C26, R37/C27 for the $IF_I$ output and R38/C28 and R39/C29 for the $IF_Q$ output, and provide intermediate frequency signals representing the multiplication of the RF input signals applied to RF inputs 142 and 144 with the time-domain square waves applied to the LO inputs 132, 134, and 136.

Figure 9:
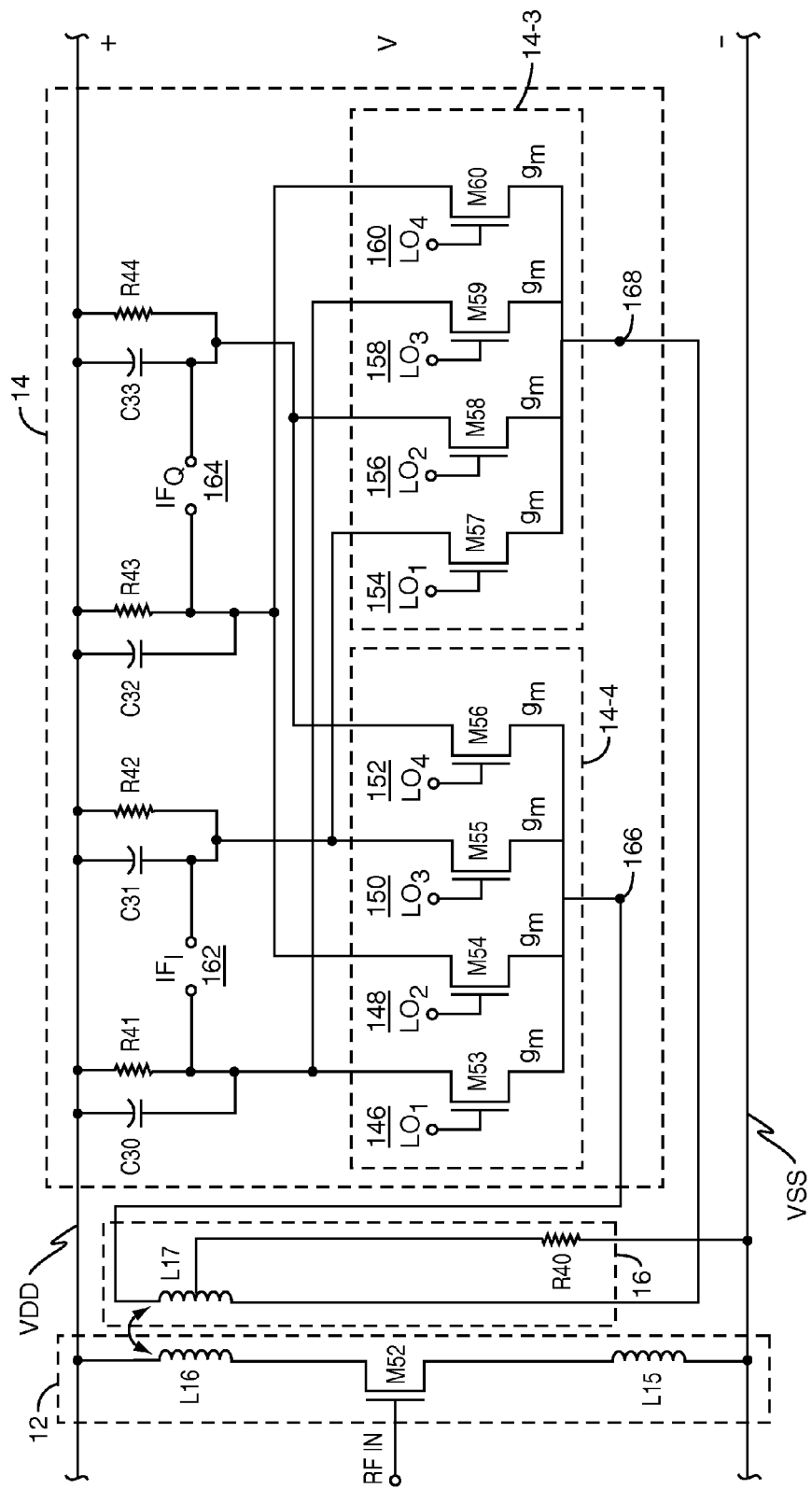
FIG. 9 is a block diagram of another embodiment of amplifier, mixer, and coupling circuits for use in a wireless communication receiver.

FIG. 9 illustrates another mixer circuit embodiment, configured as a double-balanced, AC-coupled quadrature mixer with transformer balun. This embodiment is similar to that shown in FIG. 8, but without the stacked mixer core configuration, and offers similar operational advantages.

In FIG. 9, the low-noise amplifier circuit 12 comprises an input transistor M52, a source degeneration inductor L15, and a load inductor L16, which is transformer-coupled to the inductor L17 in the coupling circuit 16. That is, the coupling circuit 16 comprises an inductive coupling circuit, including the inductor L17 that is transformer-coupled to L16 and couples the output of the low-noise amplifier circuit 12 as an RF input signal into the mixer circuit 14, which includes quadrature mixer cores 14-3 and 14-4. In this configuration, each end of the L17 inductor winding provides a balanced signal for input to the mixer circuit 14, while the resistor R40 couples the center tap of inductor L17 to the reference ground (VSS).

In-phase LO signals ($LO_1$-$LO_4$) applied to the in-phase (I) LO inputs 146, 148, 150, 152, and quadrature LO signals ($LO_1$-$LO_4$) applied to the quadrature (Q) LO inputs 154, 156, 158, and 160 drive the gates of the mixer core transistors M53, M54, M55, M56, M57, M58, M59, and M60, which are split between the quadrature cores 14-3 and 14-4. The quadrature IF outputs 162 and 164 ($IF_I$ and $IF_Q$, respectively) are coupled to a positive supply rail (VDD) through parallel RC circuits R41/C30, R42/C31 for the $IF_I$ output and R43/C32 and R44/C33 for the $IF_Q$ output, and provide intermediate frequency signals representing the multiplication of the RF input signals applied to RF inputs 166 and 168 with the time-domain square waves applied to the LO inputs.

Figure 10:
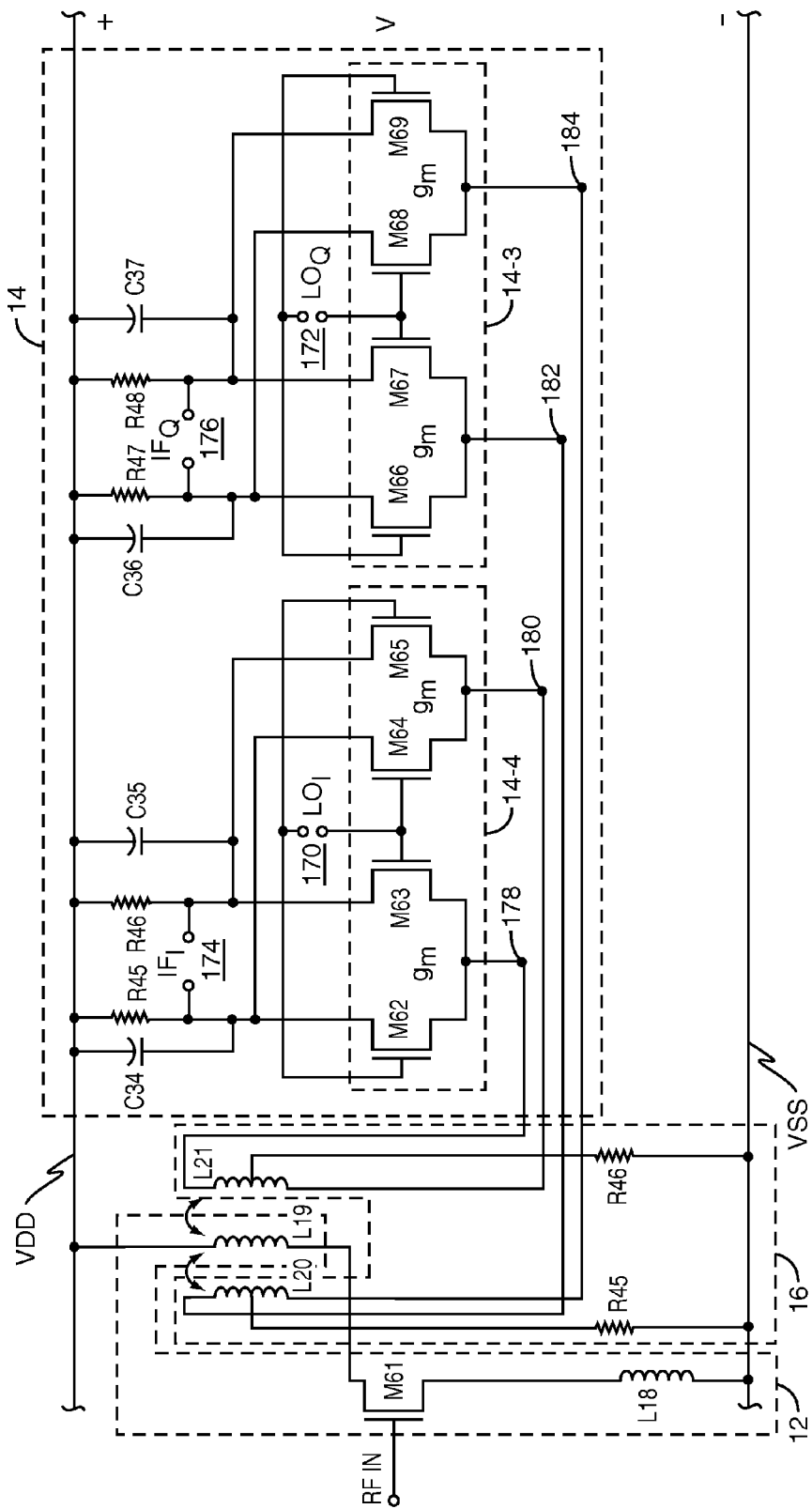
FIG. 10 is a block diagram of another embodiment of amplifier, mixer, and coupling circuits for use in a wireless communication receiver.

FIG. 10 illustrates another mixer circuit embodiment, configured as a double-balanced, AC-coupled quadrature mixer with transformer balun and signal splitter. This configuration offers similar operational advantages as the embodiments illustrated in FIGS. 8 and 9, including good insensitivity to local oscillator and bias noise and good voltage headroom.

In FIG. 10, the low-noise amplifier circuit 12 comprises an input transistor M61, a source degeneration inductor L18, and a load inductor L19, which is transformer-coupled to inductors L20 and L21 in the coupling circuit 16. That is, the L19, L20, and L21 inductors form a transformer that couples the output of the low-noise amplifier circuit 12 as a split RF input signal into the mixer circuit 14. In this configuration, each end of the L20 inductor winding provides a balanced signal for input to the mixer circuit 14, while the resistor R45 couples the center tap of inductor L20 to the reference ground (VSS). Similarly, each end of the L21 inductor winding provides a balanced signal for input to the mixer circuit 14, while the resistor R46 couples the center tap of inductor L21 to the reference ground (VSS).

LO signals applied to the in-phase (I) LO input 170 and to the quadrature (Q) LO input 172 drive the gates of the mixer core transistors M62, M63, M64, M65, M66, M67, M68, and M69. The quadrature IF outputs 174 and 176 ($IF_I$ and $IF_Q$, respectively) are coupled to a positive supply rail (VDD) through parallel RC circuits R45/C34, R46/C35 for the $IF_I$ output and R47/C36 and R48/C37 for the $IF_Q$ output. These IF outputs provide intermediate frequency signals representing the multiplication of the RF input signals applied to RF inputs 178, 180, 182, and 184 with the time-domain square waves applied to the LO inputs 170 and 172.

Figure 11:
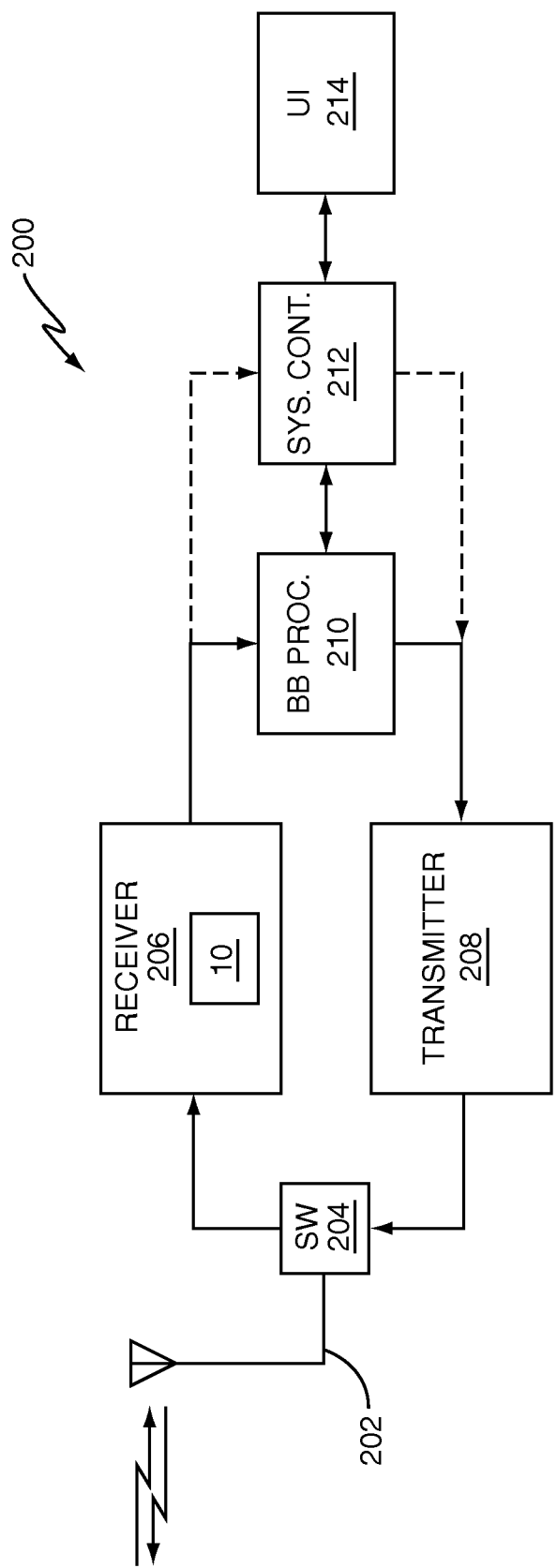
FIG. 11 is a block diagram of one embodiment of a wireless communication apparatus, including an embodiment of the amplifier, mixer, and coupling circuits as taught herein.

Those skilled in the art will appreciate the broad applicability of the receiver circuits taught herein. As a non-limiting example, FIG. 11 illustrates a wireless communication apparatus 200 that incorporates a receiver circuit 10, such as introduced in FIG. 1, wherein the receiver circuit 10 includes an embodiment of the low-noise amplifier, mixer, and coupling circuits 12, 14, and 16 taught herein. In at least one embodiment, the wireless communication apparatus 200 comprises a cellular radio telephone or other mobile wireless communication device, whether configured as a standalone device, or embedded in another device or system, e.g., a communication card for use in a laptop computer.

In any case, the illustrated embodiment of the wireless communication apparatus 200 comprises an antenna 202, a switch/duplexer 204, a receiver 206 (including the receiver circuit 10), a transmitter 208, a baseband processor 210, a system controller 212, and a user interface 214 (as needed or desired according to the intended use of the wireless communication apparatus 200). In operation, the receiver 206 provides an RF input signal to the receiver circuit 10, which is configured according to any one of the embodiments illustrated herein, or variations thereof.

Of course, the present invention is not limited by the foregoing discussion, nor is it limited by the accompanying drawings. Indeed, the present invention is limited only by the following claims, and their legal equivalents.

What is claimed is:

1. A receiver circuit comprising:
   a low-noise amplifier circuit providing one or more output signals;
   a mixer circuit having two or more signal inputs, wherein the mixer circuit includes one or more mixer cores and one or more single-ended termination circuits;
   wherein the two or more signal inputs of the mixer circuit are coupled to inputs of the one or more mixer cores, with each of the two or more signal inputs being associated with the one or more single-ended termination circuits; and
   a capacitive coupling circuit comprising a coupling capacitor for each signal input of the mixer circuit, each said coupling capacitor coupling one of said one or more output signals from the low-noise amplifier to a respective one of said two or more signal inputs;
   wherein the coupling capacitors are all matched in capacitance and the value of that capacitance is sized to reduce a sensitivity of the receiver circuit to imbalances in mixer transconductance between the signal inputs of the mixer circuit, and, in particular, wherein each coupling capacitor is sized such that $\omega C \leq g_m$, where $\omega$ is a frequency of interest, C is the capacitance value of the coupling capacitor, and $g_m$ is a transconductance value of the one or more mixer cores.

2. The receiver circuit of claim 1, wherein the mixer circuit comprises a quadrature mixer circuit having in-phase and quadrature signal inputs and the low-noise amplifier circuit comprises a single-ended low-noise amplifier circuit providing a single-ended output signal, and wherein the capacitive coupling circuit splits the single-ended output signal into the in-phase and quadrature inputs of the quadrature mixer circuit via two matched coupling capacitors.

3. A wireless communication apparatus including the receiver circuit of claim 1.

4. The receiver circuit of claim 1, wherein the mixer circuit comprises a quadrature mixer circuit having in-phase and quadrature signal inputs, the low-noise amplifier circuit provides balanced output signals, and wherein the capacitive coupling circuit includes two matched coupling capacitors respectively coupling the balanced output signals to the in-phase and quadrature signal inputs.

5. The receiver circuit of claim 1, wherein the mixer circuit comprises a double-balanced quadrature mixer circuit, the low-noise amplifier circuit provides balanced output signals, and the capacitive coupling circuit includes pairs of matched coupling capacitors for respectively splitting the balanced output signals and respectively coupling them into balanced in-phase and quadrature signal inputs of the double-balanced quadrature mixer circuit.

6. The receiver circuit of claim 1, wherein the mixer circuit comprises a double-balanced four-phase mixer circuit, the low-noise amplifier circuit includes a balanced output providing balanced output signals, and the matched capacitive coupling circuits include matched coupling capacitors capacitively coupling the balanced output signals from the low-noise amplifier circuit to respective balanced signal inputs of the double-balanced four-phase mixer circuit.

\* \* \* \* \*